(12) United States Patent
Wirbeleit et al.

(10) Patent No.: US 8,664,056 B2
(45) Date of Patent: Mar. 4, 2014

(54) TRANSISTOR WITH EMBEDDED STRAIN-INDUCING MATERIAL FORMED IN DIAMOND-SHAPED CAVITIES BASED ON A PRE-AMORPHIZATION

(75) Inventors: Frank Wirbeleit, Dresden (DE); Andy Wei, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 261 days.

(21) Appl. No.: 13/113,698

(22) Filed: May 23, 2011

(65) Prior Publication Data

US 2011/0294269 A1 Dec. 1, 2011

(30) Foreign Application Priority Data

May 31, 2010 (DE) .......................... 10 2010 029 532

(51) Int. Cl.
*H01L 21/8234* (2006.01)

(52) U.S. Cl.
USPC ........... 438/198; 438/300; 438/498; 438/504; 438/528; 438/705; 438/714; 257/E21.131; 257/E21.223; 257/E21.431

(58) Field of Classification Search
USPC ................. 438/198, 300, 528, 530, 705, 714; 257/E21.131, E21.223, E21.431
See application file for complete search history.

(56) References Cited

U.S. PATENT DOCUMENTS

| | | | |
|---|---|---|---|
| 6,403,434 B1 * | 6/2002 | Yu ................................ | 438/300 |
| 6,541,343 B1 * | 4/2003 | Murthy et al. ................ | 438/299 |
| 6,593,217 B1 * | 7/2003 | Fujisawa ....................... | 438/495 |
| 7,045,407 B2 * | 5/2006 | Keating et al. ............... | 438/198 |
| 8,120,075 B1 * | 2/2012 | Luo et al. ...................... | 257/288 |
| 8,198,194 B2 * | 6/2012 | Yang et al. .................... | 438/700 |
| 2005/0148147 A1 * | 7/2005 | Keating et al. ............... | 438/299 |
| 2007/0004123 A1 * | 1/2007 | Bohr et al. .................... | 438/230 |
| 2007/0249168 A1 * | 10/2007 | Rotondaro et al. .......... | 438/700 |
| 2007/0269952 A1 * | 11/2007 | Chong et al. ................. | 438/301 |
| 2008/0067557 A1 * | 3/2008 | Yu et al. ....................... | 257/255 |
| 2008/0142839 A1 * | 6/2008 | Fukutome et al. ........... | 257/190 |
| 2008/0237634 A1 * | 10/2008 | Dyer et al. ................... | 257/190 |
| 2010/0078689 A1 * | 4/2010 | Kronholz et al. ............ | 257/288 |
| 2011/0183481 A1 * | 7/2011 | Dyer ............................. | 438/198 |
| 2011/0294269 A1 * | 12/2011 | Wirbeleit et al. ............ | 438/197 |
| 2012/0061649 A1 * | 3/2012 | Datta et al. .................... | 257/24 |
| 2012/0080723 A1 * | 4/2012 | Lee et al. ...................... | 257/192 |
| 2012/0100684 A1 * | 4/2012 | Min et al. ..................... | 438/287 |

(Continued)

FOREIGN PATENT DOCUMENTS

DE 102008049733 B3 6/2010 ............ H01L 21/336

OTHER PUBLICATIONS

Translation of Official Communication from German Patent Office for German Patent Application No. 10 2010 029 532.9 dated Apr. 12, 2011.

*Primary Examiner* — Zandra Smith
*Assistant Examiner* — Toniae Thomas
(74) *Attorney, Agent, or Firm* — Amerson Law Firm, PLLC

(57) ABSTRACT

When forming cavities in active regions of semiconductor devices in order to incorporate a strain\-inducing semiconductor material, superior uniformity may be achieved by using an implantation process so as to selectively modify the etch behavior of exposed portions of the active region. In this manner, the basic configuration of the cavities may be adjusted with a high degree of flexibility, while at the same time the dependence on pattern loading effect may be reduced. Consequently, a significantly reduced variability of transistor characteristics may be achieved.

19 Claims, 5 Drawing Sheets

(56) References Cited

U.S. PATENT DOCUMENTS

| | | | |
|---|---|---|---|
| 2012/0108026 A1* | 5/2012 | Nieh et al. | 438/300 |
| 2012/0119302 A1* | 5/2012 | Pei et al. | 257/382 |
| 2012/0299058 A1* | 11/2012 | Huang et al. | 257/190 |
| 2012/0302018 A1* | 11/2012 | Shin et al. | 438/198 |
| 2012/0319166 A1* | 12/2012 | Adam et al. | 257/192 |
| 2012/0319203 A1* | 12/2012 | Cheng et al. | 257/346 |
| 2013/0017660 A1* | 1/2013 | Fang et al. | 438/299 |

* cited by examiner

TRANSISTOR WITH EMBEDDED STRAIN-INDUCING MATERIAL FORMED IN DIAMOND-SHAPED CAVITIES BASED ON A PRE-AMORPHIZATION

BACKGROUND OF THE INVENTION

1. Field of the Invention

Generally, the present disclosure relates to the fabrication of integrated circuits, and, more particularly, to transistors having strained channel regions by using embedded silicon/germanium (Si/Ge) so as to enhance charge carrier mobility in the channel regions of the transistors.

2. Description of the Related Art

The fabrication of complex integrated circuits requires the provision of a large number of transistor elements, which represent the dominant circuit element for complex circuits. For example, several hundred millions of transistors may be provided in presently available complex integrated circuits. Generally, a plurality of process technologies are currently practiced, wherein, for complex circuitry, such as microprocessors, storage chips and the like, CMOS technology is currently the most promising approach due to the superior characteristics in view of operating speed and/or power consumption and/or cost efficiency. In CMOS circuits, complementary transistors, i.e., P-channel transistors and N-channel transistors, are used for forming circuit elements, such as inverters and other logic gates to design highly complex circuit assemblies, such as CPUs, storage chips and the like. During the fabrication of complex integrated circuits using CMOS technology, transistors, i.e., N-channel transistors and P-channel transistors, are formed on a substrate including a crystalline semiconductor layer. A MOS transistor, or generally a field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed in the vicinity of the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a given extension of the channel region in the transistor width direction, the distance between the source and drain regions, which is also referred to as channel length. Thus, the reduction of the channel length, and associated therewith the reduction of the channel resistivity, is a dominant design criterion for accomplishing an increase in the operating speed of the integrated circuits.

The continuing shrinkage of the transistor dimensions, however, involves a plurality of issues associated therewith that have to be addressed so as to not unduly offset the advantages obtained by steadily decreasing the channel length of MOS transistors. For example, highly sophisticated dopant profiles, in the vertical direction as well as in the lateral direction, are required in the drain and source regions so as to provide low sheet and contact resistivity in combination with desired channel controllability. Moreover, the gate dielectric material may also be adapted to the reduced channel length in order to maintain the required channel controllability. However, some mechanisms for maintaining high channel controllability may also have a negative influence on the charge carrier mobility in the channel region of the transistor, thereby partially offsetting the advantages gained by the reduction of the channel length.

Since the continuous size reduction of the critical dimensions, i.e., the gate length of the transistors, necessitates the adaptation and possibly the new development of highly complex process techniques and may also contribute to less pronounced performance gain due to mobility degradation, it has been proposed to enhance the channel conductivity of the transistor elements by increasing the charge carrier mobility in the channel region for a given channel length, thereby enabling a performance improvement that is comparable with the advance to a technology standard requiring extremely scaled critical dimensions, while avoiding or at least postponing many of the process adaptations associated with device scaling.

One efficient mechanism for increasing the charge carrier mobility is the modification of the lattice structure in the channel region, for instance by creating tensile or compressive stress in the vicinity of the channel region so as to produce a corresponding strain in the channel region, which results in a modified mobility for electrons and holes, respectively. For example, creating tensile strain in the channel region for a standard crystallographic configuration of the active silicon material, i.e., a (100) surface orientation with the channel length aligned to the <110> direction, increases the mobility of electrons, which in turn may directly translate into a corresponding increase in conductivity. On the other hand, compressive strain in the channel region may increase the mobility of holes, thereby providing the potential for enhancing the performance of P-type transistors. The introduction of stress or strain engineering into integrated circuit fabrication is an extremely promising approach, since strained silicon may be considered as a "new" type of semiconductor material, which may enable the fabrication of fast powerful semiconductor devices without requiring expensive semiconductor materials, while many of the well-established manufacturing techniques may still be used.

Consequently, it has been proposed to introduce, for instance, a silicon/germanium material next to the channel region so as to induce a compressive stress that may result in a corresponding strain. When forming the Si/Ge material, the drain and source regions of the PMOS transistors are selectively recessed to form cavities, while the NMOS transistors are masked, and subsequently the silicon/germanium material is selectively formed in the cavities of the PMOS transistor by epitaxial growth.

Although the technique has significant advantages in view of performance gain of P-channel transistors and thus of the entire CMOS device, it turns out, however, that, in advanced semiconductor devices including a large number of transistor elements, an increased variability of device performance may be observed, which may be associated with the above-described technique for incorporating a strained silicon/germanium alloy in the drain and source regions of P-channel transistors.

The presence of a strain-inducing silicon/germanium material in the drain and source regions of P-channel transistors may drastically alter the current drive capability of the transistor and, thus, even small variations during the incorporation of the silicon/germanium material or any variations of the material composition may, therefore, significantly affect performance of the P-channel transistor. The strain-inducing effect of the embedded silicon/germanium material depends on the amount of the embedded strain-inducing semiconductor material, the distance with respect to the channel region and also depends on the size and shape of the strain-inducing semiconductor material. For example, incorporating an increased fraction of germanium may result in an increase of the resulting strain, since the corresponding lattice mismatch between the silicon/germanium material and the silicon material of the active region may be increased. The maximum concentration of germanium in the semiconductor alloy, however, may depend on the process strategy used, since further increasing the germanium concentration may result in undue germanium agglomeration, which in turn may provide increased lattice defects and the like. Furthermore, the amount of the strain-inducing material and the shape thereof in the drain and source regions may depend on the size and shape of the cavities formed in the drain and source areas, wherein the effective distance from the channel region may also be substantially determined on the basis of the size and shape of the corresponding cavities. Consequently, for a given deposition recipe of providing the strain-inducing silicon/germanium material, i.e., for a given germanium concentration in the semiconductor material, the size and shape of the cavities may play an important role in adjusting the overall performance of the transistor, wherein, in particular, across-die uniformity and across-substrate uniformity of the resulting performance gain of P-channel transistors may be significantly determined on the basis of the size and shape of the cavities.

A typical conventional process flow for forming an embedded silicon/germanium material in P-channel transistors may include the following process steps. After forming the active semiconductor regions for forming transistors therein and thereabove, which is typically accomplished by forming appropriate isolation regions that laterally delineate the active regions, the gate electrode structures are formed on the basis of any appropriate process strategy. That is, appropriate materials, such as dielectric materials, electrode materials and the like, are provided in combination with one or more appropriate dielectric cap materials, which may be used, in addition to the actual patterning of the gate layer stack, as etch and deposition masks in a later manufacturing stage, when forming the embedded strain-inducing silicon/germanium material. In sophisticated applications, the gate electrode structures of field effect transistors may be provided with a gate length of 50 nm and less, thereby providing the basic sophisticated transistor performance, for instance in terms of switching speed and drive current capability. The reduced critical dimensions, however, may also contribute to a pronounced dependency of the resulting transistor performance on process variations, in particular when produced upon implementing a very efficient performance-enhancing mechanism, such as embedding the strain-inducing silicon/germanium material in P-channel transistors. For example, a variation of the lateral distance of the silicon/germanium material with respect to the channel region may over-proportionally influence the finally obtained performance, in particular when basically extremely scaled transistors are considered. For example, forming any sidewall spacers on the gate electrode structures for preserving integrity of sensitive materials, such as the gate dielectric material, the electrode material and the like, may significantly influence the lateral distance, wherein all but readily reducing the resulting spacer width may not be compatible with other device requirements, such as integrity of the gate materials. Consequently, in particular for a reduced gate length, even a minute variation of the spacer width may significantly contribute to overall variability of the resulting performance gain obtained by the embedded silicon/germanium material. Based on the dielectric cap material and the sidewall spacer structures, cavities may then be etched into the drain and source areas, wherein the size and shape may be substantially determined on the basis of the etch parameters of the corresponding etch strategy. It should be appreciated that any other transistors, such as N-channel transistors, in which an incorporated silicon/germanium material is not required, are covered by an appropriate mask layer. It is well known that the etch rate in anisotropic plasma assisted processes may depend on the local neighborhood of a certain device area. In plasma assisted anisotropic etch processes, which may be performed on the basis of hydrogen bromide and the like, for etching silicon material, appropriate organic additives are used in order to adjust the anisotropic nature in combination with appropriately selected plasma conditions of the etch process under consideration. The presence of reactive components, organic additives and even the plasma conditions may, however, slightly vary depending on the local conditions, such as the "density" of circuit elements and the like. That is, the local configuration of the semiconductor device may affect the local etch conditions, for instance, in one area, a plurality of exposed surface areas to be etched may be present, while, in other device areas, a significantly reduced "density" of corresponding surface areas may be present, thereby contributing to a different etch behavior in these areas. For example, upon forming cavities in the silicon-based drain and source regions of transistors, in densely packed device areas, i.e., in device areas in which closely spaced gate electrodes of transistors may be present, a different etch behavior occurs compared to less densely packed device areas. A corresponding effect is also well known as "pattern loading," which may thus result in a difference in size and/or shape of the resulting cavities, which in turn may, therefore, contribute to very pronounced variability of transistor performance, as is also discussed above.

In some conventional approaches, the variability in size and shape of the resulting cavities is compensated for, at least to a certain degree, by additionally performing a wet chemical etch process that has a high crystallographic anisotropy so that precise control of the lateral offset of the cavities and their size and shape may be accomplished. For example, a crystallographically anisotropic etch process may be accomplished by using well-established etch reagents, such as tetra methyl ammonium hydroxide (TMAH), potassium hydroxide and the like, wherein the wet chemical etch chemistry has an inherent "anisotropic" etch behavior with respect to different crystallographic orientations of the silicon material to be patterned. Consequently, this inherent difference in etch rate provides a restricted etch behavior in the lateral direction of the cavities for a standard crystallographic configuration of the silicon-based material, thereby obtaining superior process uniformity with respect to the size and shape of the resulting cavities. Typically, a standard crystallographic orientation of a silicon material is used, i.e., a (100) surface orientation with the transistor length directions oriented along a <110> direction, or any physically equivalent direction, wherein a significantly reduced etch rate along <111> directions is observed compared to other crystallographic axes, such as the <110>, <100> axes or any corresponding equivalent directions. It should be appreciated that, in this application, corresponding crystallographic orientations are to be understood as representing physically equivalent orientations, i.e., a <100> orientation is to be understood as representing any physically equivalent orientations, such as <010>, <001>, <−100> and the like. The same holds true for crystal planes.

Consequently, upon applying a final crystallographically anisotropic etch step, well-defined sidewall surfaces may be formed in the cavity, for instance according to the crystal geometry, wherein the (111) planes may act as "etch stop" layers.

Although this conventional approach may provide superior etch conditions and, thus, a superior shape of the resulting cavities, it, nevertheless, turns out that a significant variation in cavity depth across semiconductor die regions may be observed, wherein a reduced cavity depth is encountered in device areas comprising closely spaced gate electrode structures, while an increased depth can be found in device areas of less densely packed transistors.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing strategies for incorporating a semiconductor material in cavities provided in the drain and source areas of transistors with a significantly reduced dependency on pattern loading effects when forming the corresponding cavities. To this end, the material of the semiconductor region to be patterned may be appropriately modified on the basis of a process strategy having a significantly reduced or no pattern loading effect at all, such as an ion implantation process, thereby forming a "template" in the semiconductor-based material. The modified semiconductor material may then be etched on the basis of an isotropic etch process, such as a wet chemical etch process, an isotropic plasma assisted etch process, wherein the modified material may provide superior uniformity and controllability of the etch process. In some illustrative embodiments, the material modification may result in the creation of significant crystal damage and, thus, amorphization of the material, which may, therefore, result in a significantly different etch rate or in a different response to any other material treatment process, such as an oxidation process, so that superior uniformity in terms of size and shape of a corresponding cavity may be achieved. Additionally, a superior shape may be obtained by performing a crystallographically anisotropic etch process, for instance for obtaining well-defined sidewall surface areas connecting to the channel region of the transistors under consideration.

One illustrative method disclosed herein comprises forming, in an initially crystalline active region of a transistor, an amorphous portion laterally adjacent to a gate electrode structure of the transistor. The method further comprises performing a first etch process so as to remove material of the amorphous portion in a substantially direction-independent manner and so as to provide a cavity. The method further comprises performing a second etch process so as to adjust the size and shape of the cavity, wherein the second etch process has a crystallographically anisotropic removal rate. Furthermore, the method comprises forming a strain-inducing semiconductor alloy at least in the cavity by performing a selective epitaxial growth process.

A further illustrative method disclosed herein relates to forming a transistor. The method comprises performing an ion implantation process so as to introduce an implantation species into a semiconductor region that is laterally adjacent to a gate electrode structure. The method further comprises forming cavities in the semiconductor region laterally adjacent to the gate electrode structure by performing an etch process and controlling the etch process by using the implantation species. Additionally, the method comprises forming a strain-inducing semiconductor alloy in the cavities and forming drain and source regions in the semiconductor region adjacent to the gate electrode structure.

A still further illustrative method disclosed herein relates to forming a semiconductor device. The method comprises modifying a portion of an active region of a transistor so as to have an increased removal rate with respect to an isotropic etch recipe. The method further comprises performing an etch process and applying the etch recipe so as to form a cavity in the active region. Moreover, at least one inclined sidewall surface is formed in the cavity and a strain-inducing semiconductor alloy is formed in the cavity.

BRIEF DESCRIPTION OF THE DRAWINGS

The disclosure may be understood by reference to the following description taken in conjunction with the accompanying drawings, in which like reference numerals identify like elements, and in which.

Figure 1A:
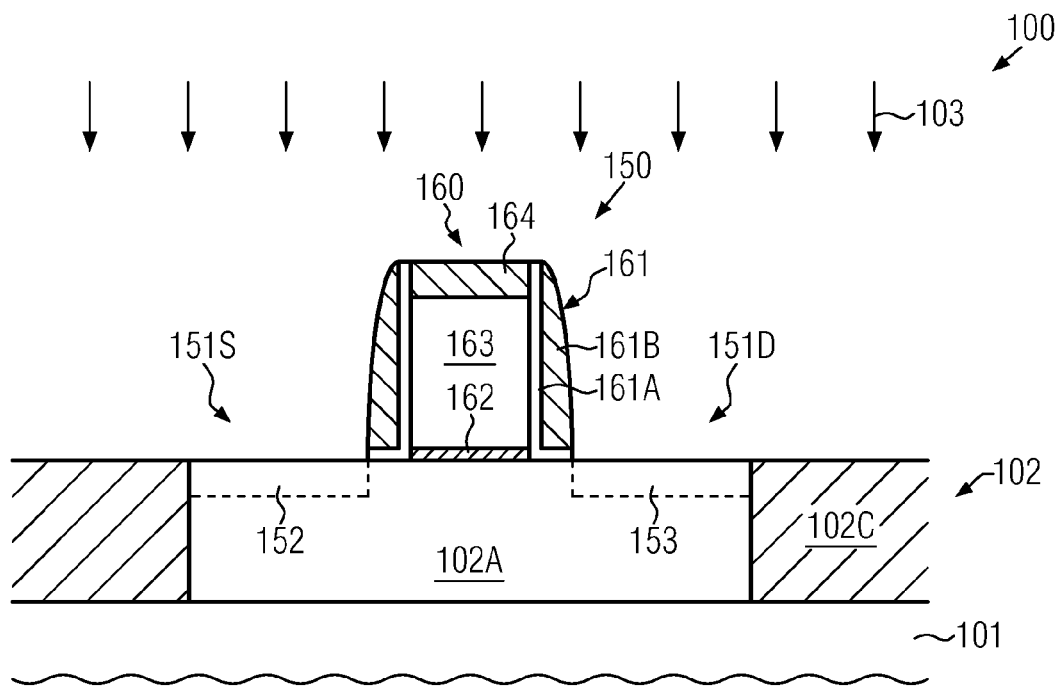
FIGS. 1a-1b schematically illustrate cross-sectional views of a semiconductor device during a process having a reduced pattern loading dependency, such as an ion implantation process, in order to modify a surface portion of the semiconductor material of an active region adjacent to a gate electrode structure, thereby efficiently determining the size and shape of the cavities to be formed in the active region, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides techniques for providing cavities in active regions of transistors by applying a process of reduced sensitivity to pattern loading effects in order to determine the size and shape of cavities and, thus, of the resulting embedded semiconductor materials, such as strain-inducing semiconductor materials in the form of silicon/germanium, silicon/carbon and the like. It should be appreciated that, in this context, a strain-inducing semiconductor mixture, such as a silicon/germanium material, may also be referred to as a semiconductor alloy and may represent a substantially crystalline semiconductor material having a different natural lattice constant compared to a silicon material.

The superior uniformity in defining the shape and size of cavities may, in some illustrative embodiments, be accomplished on the basis of an ion implantation process, in which an appropriate implantation species may be incorporated so as to modify the material characteristics of the exposed portion of the active region, for instance in terms of etch rate, oxidation rate and the like. It is, for example, well known that the pluralities of efficient etch chemistries, such as TMAH and the like, may have a significantly different etch rate in a semiconductor material, such as a silicon material, when having incorporated therein an appropriate implantation species, compared to the material without including the implantation species. For example, the incorporation of xenon may result in a reduction of the overall etch rate, in particular, after re-establishing the initial crystallographic configuration, when TMAH is used for etching silicon selectively with respect to silicon dioxide, silicon nitride and the like. Furthermore, TMAH may have a different etch rate, i.e., a significantly higher etch rate, in a substantially amorphous silicon material compared to a crystalline semiconductor material so that intentionally creating heavy crystal damage may result in a higher removal rate and may, thus, allow an efficient control of the subsequent etch process. Similarly, other etch chemicals may respond differently to a modification of the crystalline structure, for instance by providing an increased etch rate for a substantially amorphous material, thereby also enabling a desired adjustment of the size and shape of cavities to be formed in a subsequent etch process.

In other cases, the oxidation rate of the silicon material may be efficiently modified, for instance, increased by amorphizing a portion of the active region so that superior uniformity in forming an oxide may be accomplished, even if the oxidation process itself may exhibit a certain dependency on pattern density differences.

Consequently, by appropriately shaping the implant profile during the implantation process, the desired size and shape of the cavity to be formed may be defined, wherein, in some illustrative embodiments, the size and shape may be "fine-tuned" in a further etch process performed on the basis of a crystallographically anisotropic etch process. For example, in some illustrative embodiments, the entire etch sequence for providing the cavity on the basis of the modified semiconductor material may be accomplished by using wet chemical etch chemistries without requiring any plasma assisted etch processes. In this manner, a very efficient overall process flow may be accomplished.

FIG. 1a schematically illustrates a cross-sectional view of a semiconductor device 100 comprising a substrate 101, above which may be provided a semiconductor layer 102, which may be silicon-based semiconductor material, as the majority of complex integrated circuits are and will be in the foreseeable future produced on the basis of silicon material. It should be appreciated, however, that the principles disclosed herein may also be applied to other semiconductor materials, such as a silicon/germanium material and the like, wherein a corresponding strain\-inducing mechanism is to be implemented on the basis of an embedded semiconductor material or when any semiconductor material is to be newly embedded in an active region of a semiconductor device. The semiconductor lay 102 may represent a portion of a crystalline substrate material of the substrate 101, when a bulk configuration is considered. In other cases (not shown), a buried insulating material may be provided below the semiconductor layer 102. As illustrated, in the manufacturing stage shown, the device 100 may comprise an isolation structure 102C, which may laterally delineate a plurality of active regions or semiconductor regions in the layer 102, wherein, for convenience, a single active region 102A is illustrated in FIG. 1a. It should be appreciated that the term semiconductor layer used herein for the layer 102 is to be understood as referring to a material layer that may initially be provided in the form of a semiconductor material, which, however, may include other non-semiconductor materials, such as the isolation structures 102C, in an advanced manufacturing stage. The semiconductor region or active region 102A may be understood as an active region in the sense that one or more transistors, such as a transistor 150, may be formed in and above the semiconductor region 102A. That is, the semiconductor region 102A may have or receive any appropriate basic dopant concentration in order to adjust the basic transistor characteristics, while also PN junctions have to be formed in the active region 102A in a later manufacturing stage so as to complete the transistor 150.

In the manufacturing stage shown, a gate electrode structure 160 may be formed on the active region 102A and may have any appropriate configuration with respect to device requirements and the further processing of the device 100. For example, a gate dielectric material 162, such as a silicon oxide based material, a high-k dielectric material or any combination thereof, may be provided, in combination with an appropriate electrode material 163, such as a silicon material and the like, may be provided with an appropriate gate length, i.e., in FIG. 1a, the horizontal extension, which may be 50 nm and less in sophisticated applications. Furthermore, a sidewall spacer structure 161, which may, for instance, comprise a liner 161A and a spacer element 161B, may be provided on sidewalls so as to preserve integrity of the materials 162, 163. Furthermore, a dielectric cap material or materials 164 may be provided, which may act as an etch and deposition mask during the further processing. The spacer structure 161 may be provided in the form of a silicon nitride material, a silicon dioxide material and the like. Similarly, the dielectric cap layer 164 may be provided in the form of any appropriate dielectric material.

The device 100 may comprise a modified region 152 provided at a source side 151S of the transistor 150, while, in the example shown, a modified region 153 may also be provided in the active region 102A at a drain side 151D. In some illustrative embodiments, the modified regions 152, 153 may have a significantly increased amount of lattice defects relative to the remaining active region 102A. That is, the average concentration of lattice defects in the regions 152, 153 may at least be five orders of magnitudes greater than in the remaining active region 102A, which may also be referred to as being in an amorphous state. For example, in addition to the increased amount of lattice defects, the regions 152, 153 may also have incorporated therein an increased amount of a specific implantation species, such as xenon, germanium and the like, which may be used for generating the desired amorphized state of the regions 152, 153. The size and shape of the regions 152, 153 may, thus, be "defined" by implantation-specific "boundaries," which may have a certain degree of variability due to the nature of an implantation process. In this application, a portion of the active region 102A may be considered as being outside of the regions 152, 153, when an average concentration of lattice defects in an appropriately selected unit volume has a value that is less than two orders of magnitude of a maximum concentration of lattice defects. That is, if a maximum concentration of lattice defects is determined somewhere within the regions 152, 153, any area of the active region 102A is considered as being outside of the regions 152, 153 whenever an average concentration is encountered that is at least two orders of magnitude lower than the maximum concentration.

The semiconductor device 100 as shown in FIG. 1a may be formed on the basis of the following process techniques. The isolation structures 102C may be provided in the semiconductor layer 102 on the basis of any appropriate manufacturing strategy, i.e., providing an appropriate hard mask on the basis of sophisticated lithography techniques and patterning the semiconductor layer 102 so as to form trenches, which may subsequently be filled with any appropriate dielectric material. After the removal of any excess material and of any hard mask materials, the further processing may be continued by providing appropriate materials for the gate electrode structure 160 and patterning the resulting layer stack by using sophisticated lithography and patterning techniques. In this way, the gate dielectric material 162, the electrode material 163 and the cap material 164 may be provided with a desired gate length and subsequently the spacer structure 161 may be formed, for instance by well-controllable deposition and etch techniques in order to obtain the desired confinement of the sensitive materials 162, 163 and also provide the desired lateral offset for the further processing for incorporating a semiconductor material in the region 102A. To this end, well-established low pressure chemical vapor deposition (CVD), multi-layer deposition techniques and the like may be applied. It should be appreciated that other transistors and gate electrode structures may be covered by a mask layer, such as the material layers used for forming the spacer structure 161 and the like. Thereafter, the modified regions 152, 153 may be formed on the basis of an ion-bombardment or implantation process 103, in which an appropriate implantation species, such as xenon, germanium, silicon and the like, may be used in order to provide the desired material modification. For example, as previously discussed, the modification may be seen in the provision of a significant amount of lattice defects, thereby converting substantially crystalline material of the region 102A locally into an amorphous portion, thereby endowing the regions 152, 153 with significantly different etch rates with respect to a plurality of well-established etch strategies compared to the remaining portion of the active region 102A. To this end, process parameters of the ion implantation process 103 may be selected, for a given implantation species, so as to appropriately define the average penetration depth and the concentration maximum of implantation species at a specific depth within the active region 102A. For example, heavy ions, such as xenon, germanium and the like, may generate pronounced lattice damage for moderately low implantation dose values of, for instance, $10^{14}$-$10^{15}$ per $cm^2$. Appropriate process parameters may be readily established on the basis of simulation, experiments and the like in order to, for instance, adjust the depth of the regions 152, 153.

In other illustrative embodiments, the implantation process 103 may be performed so as to appropriately position a concentration maximum of a desired implantation species at a desired depth in order to provide superior control of a subsequent etch process. For example, a plurality of etch chemistries may be sensitive to certain implantation species, such as dopants in the form of N-type dopant species, xenon and the like, thereby enabling a significant reduction of etch rate, for instance, when re-establishing a substantially crystalline state.

Figure 1B:
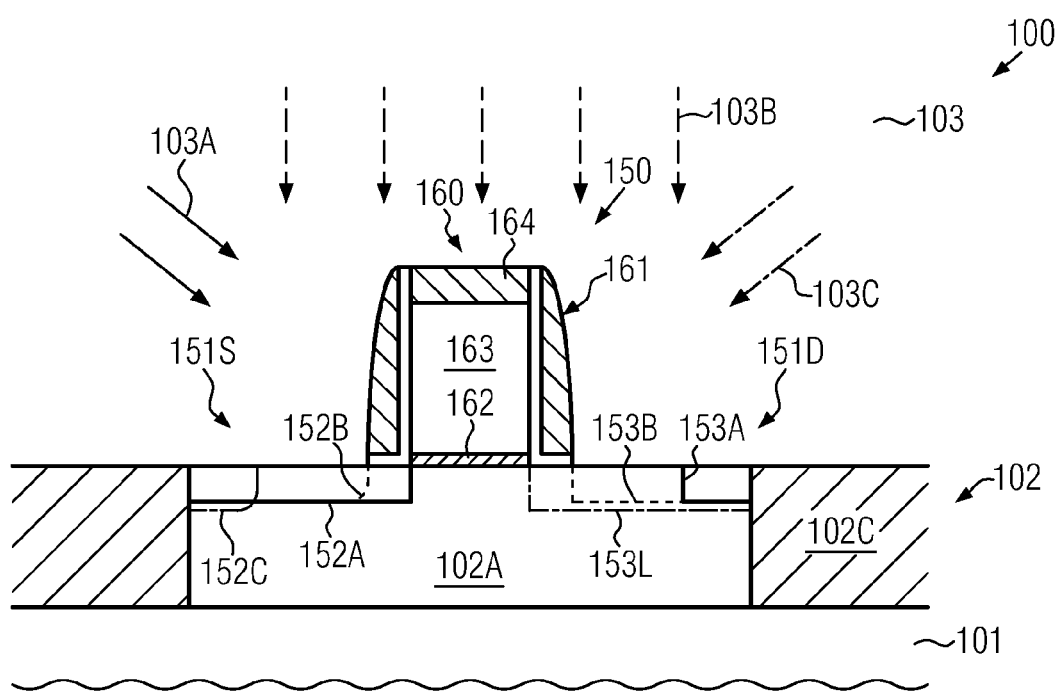

FIG. 1b schematically illustrates the semiconductor device 100 during an implantation process or sequence of processes in order to adjust the size and shape of the modified portions within the active region 102A with a superior degree of flexibility. As illustrated, in addition to or alternatively to the implantation process 103 as shown in FIG. 1a, an implantation process 103A may be applied, wherein the incoming ion beam may be tilted with respect to a surface normal, thereby providing an increased penetration depth in a lateral direction at the source side 151S, as indicated by the modified region 152A. That is, the region 152A may extend below the spacer structure 161, wherein a corresponding degree of overlap may be determined on the basis of implantation energy and tilt angle of the tilted implantation step 103A. On the other hand, the gate electrode structure 160 may efficiently block the incorporation of the implantation species during the process 103A at the drain side 151D, thereby forming the region 153A as shown. Furthermore, additionally or alternatively, an implantation process 103B with a substantially zero tilt angle, for instance as also described above with reference to the implantation process 103 in FIG. 1a, may be performed, thereby forming the modified portions 152B, 153B, wherein a combination of the regions 152A, 152B may have an increased overlap compared to the combination of the regions 153B and 153A, which may be advantageous, when an asymmetric configuration for a strain-inducing semiconductor alloy is considered advantageous. Similarly, a tilted implantation process 103C may be applied, thereby forming the modified region 153L, which may have a desired overlap with the gate electrode structure 160, while, on the other hand, the corresponding region 152C may be significantly offset from the gate electrode structure 160. Consequently, by combining the implantation processes 103A, 103B on the one hand or by combining the implantation processes 103B, 103C on the other hand, an asymmetric configuration may be obtained for the resulting combined modified portions. In other cases, when combining at least the tilted implantation steps 103A, 103C, an increased degree of overlapping may be obtained, wherein the resulting configuration may be symmetric, when the same process parameters may be used during the implantation processes 103A, 103C, except for the sign of the tilt angle, while, in other cases, an asymmetric configuration may be accomplished by using different implantation parameters. It should be appreciated that also a different depth of the modified regions may be accomplished, at least in the vicinity of the gate electrode structure, by using different magnitudes for the tilt angle and/or different implantation energy. For example, when performing the implantation process 103A, a reduced tilt angle and/or increased implantation energy may result in a deeper region 152A if desired, while a corresponding adaptation of the implantation parameters of the process 103B and/or 103C may result in a reduced depth of the regions 153B and/or 153L. Consequently, by applying an appropriate implantation sequence and corresponding process parameters, the size and shape of the modified regions 152, 153, or any combinations of the modified regions 152A, 152B, 152C, 153A, 153B, 153L, may be obtained.

Figure 1C:
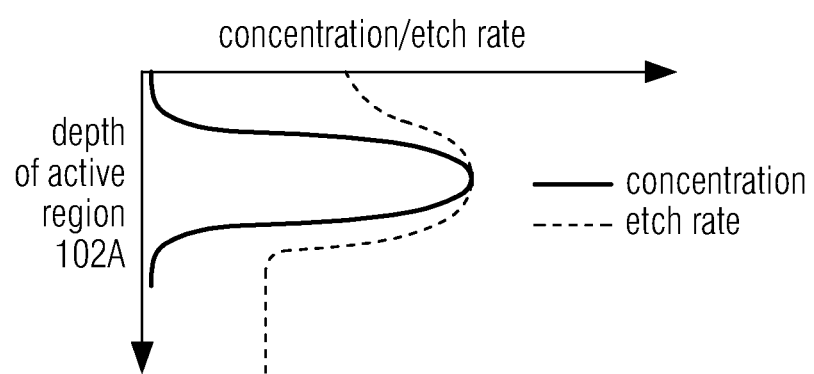
FIG. 1c schematically illustrates a dopant concentration profile of an implantation species incorporated into the active region for defining the size and shape of cavities, according to illustrative embodiments.

FIG. 1c schematically illustrates the dependency of concentration and/or etch rate with respect to depth of the active region 102A. As illustrated, the vertical axis may represent the depth of the active region 102A, while the horizontal axis may represent the concentration and the etch rate for a given etch recipe. The solid line may represent the concentration of an implantation species, such as xenon, germanium and the like, which may be incorporated such that the concentration maximum may be located at a specific depth within the active region 102A, wherein, however, the concentration of the resulting lattice defects may have a somewhat different progression, and may be represented by the dashed line, which corresponds to an associated etch rate and which may depend on the concentration of lattice defects. In the qualitative illustration in FIG. 1c, it may be evident that a desired modification of the etch rate may be obtained on the basis of the previously performed implantation process, wherein the local modification may be accomplished by selecting appropriate implantation parameters. For example, as illustrated, at a certain depth, the etch rate may significantly drop and may, thus, provide the possibility of significantly enhancing uniformity during a corresponding etch process, thereby also reducing any pattern loading effects of the etch process.

It should be appreciated that a similar correlation of concentration and/or etch rate may exist for the horizontal "boundary" of the modified portions 152, 153 (FIG. 1a).

Figure 1D:
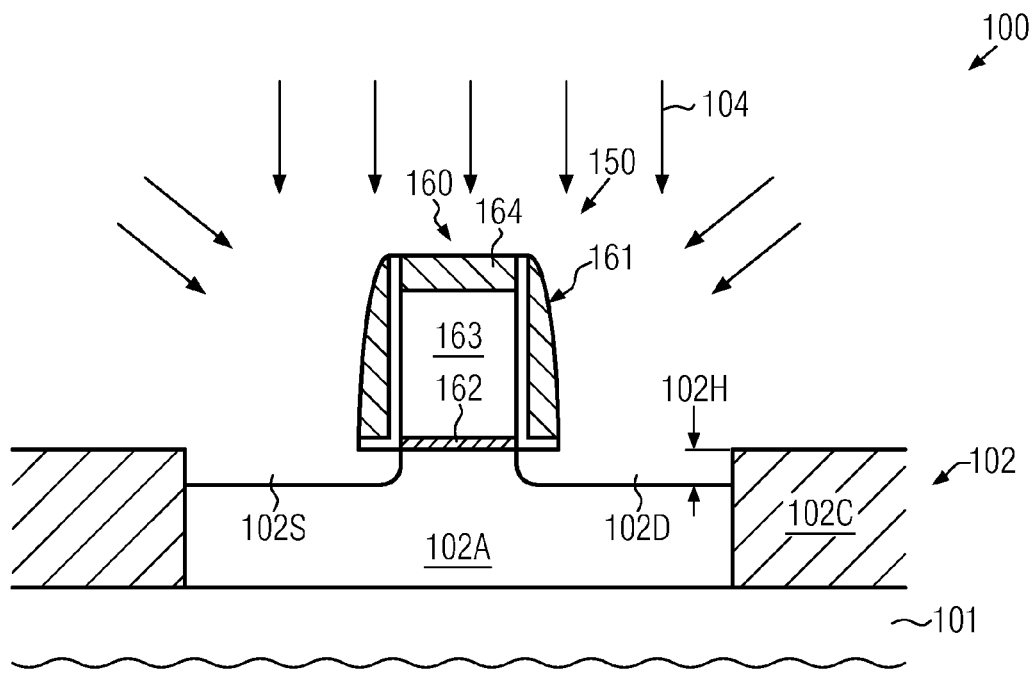
FIGS. 1d-1g schematically illustrate cross-sectional views of the semiconductor device during various manufacturing stages in completing a transistor having incorporated a strain-inducing semiconductor alloy formed on the basis of cavities of superior shape and size, according to illustrative embodiments.

FIG. 1d schematically illustrates the semiconductor device 100 in a further advanced manufacturing stage. As illustrated, an etch process 104 may be performed to remove a portion of the active region 102A so as to provide cavities 102S, 102D laterally adjacent to the gate electrode structure 160, wherein a certain degree of "overlap" may be adjusted on the basis of the previously performed implantation sequence. The etch process 104 may, in some illustrative embodiments, be performed on the basis of a wet chemical etch recipe, for instance using TMAH, potassium hydroxide and the like, wherein, in this case, the corresponding etch chemistries may have a substantially isotropic etch behavior within the modified portions 152, 153 (FIG. 1a), since the crystal structure is substantially destroyed in these areas. Furthermore, due to the amorphous state, the etch rate may be substantially higher compared to the crystalline portion of the active region 102A, so that the amorphous materials may be efficiently removed, wherein the corresponding etch rate may significantly drop when the concentration of lattice defects drops, thereby providing a self-controlling etch behavior. For example, at the trailing edge of the concentration and, thus, of the etch rate as shown in FIG. 1c, a significant drop of etch activity may occur and may, thus, provide superior uniformity of the etch process 104, even if locally varying etch conditions due to differences in pattern density may occur. That is, any "non-uniform" advance of the etch process in a stage of significantly reduced etch rate may contribute significantly less to the overall process uniformity, compared to traditional strategies, in which the entire process may be performed on the basis of a non-modified material and basically substantially the same etch rate so that corresponding locally varying etch conditions may significantly contribute to non-uniformities in size and shape of the resulting cavities.

As previously discussed with reference to FIG. 1b, a difference in depth of the cavities 102S, 102D may be accomplished during the etch process 104, while nevertheless providing a high degree of uniformity. Similarly, a desired degree of overlapping or asymmetric configuration may be obtained during the etch process 104 due to the previously provided modified portions (see FIGS. 1a and 1b). Consequently, a high degree of uniformity, for instance for a depth 102H of the cavities 102S, 102D, may be accomplished.

It should be appreciated that the etch process 104 may be performed on the basis of a crystallographically anisotropic wet chemical etch recipe, while, in other cases, isotropic plasma assisted etch recipes may be used. Due to the previous modification, at any rate, a substantially direction-independent etch behavior may be obtained during the removal of the modified material portion.

Figure 1E:
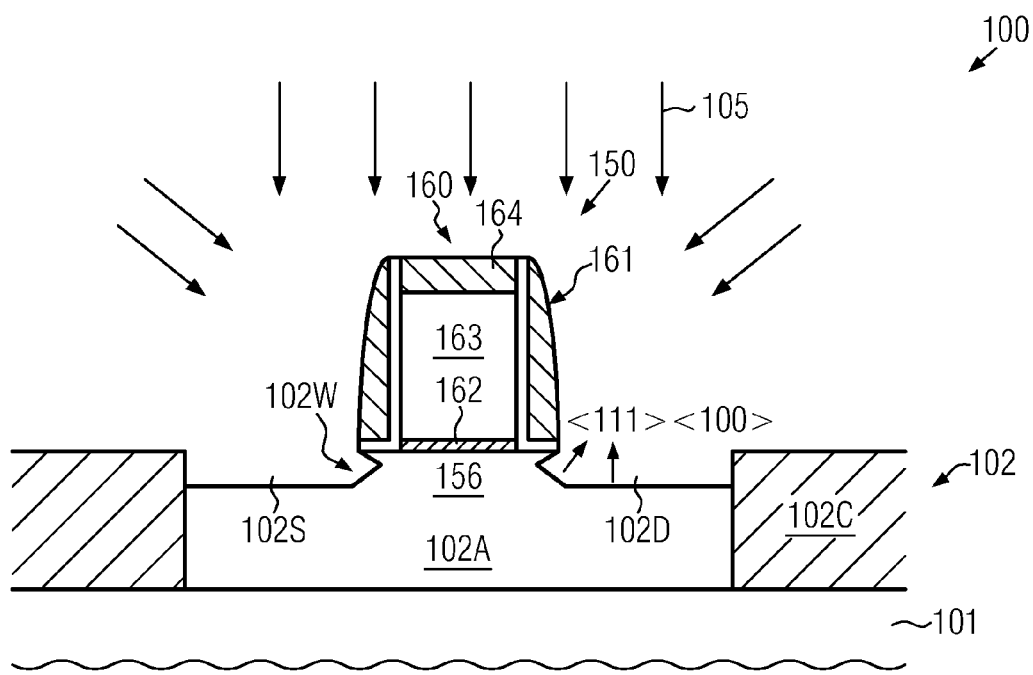

FIG. 1e schematically illustrates the semiconductor device 100 according to further illustrative embodiments in which an additional etch process 105 may be performed on the basis of a crystallographically anisotropic etch recipe, for instance based on TMAH and the like, in order to provide a superior overall configuration and uniformity of the cavities 102S, 102D. In the embodiment shown, a substantially standard crystallographic orientation may be used for the active region 102A, wherein a <100> orientation may be perpendicular to horizontal surface areas of the active region 102A, such as the bottom of the cavities 102S, 102D. In this configuration, an inclined sidewall surface 102W may be formed, for instance substantially representing the crystal geometry with respect to <111> orientations, thereby providing superior uniformity in connecting to a channel region 156. In some illustrative embodiments, the etch processes 104, 105 may be performed as individual etch steps on the basis of a wet chemical etch recipe, for instance using the same reagent, possibly with different process parameters, such as concentration, temperature and the like, so as to individually appropriately adjust the corresponding etch conditions. Thus, during the process 104 of FIG. 1d, the basic shape and size of the cavities 102S, 102D may be adjusted with a high degree of uniformity across the entire substrate 101, while, during the etch process 105, the size and shape may be tuned in accordance with device and process requirements. It should be appreciated that different process conditions during the process 105 compared to the process 104 may provide an increased etch rate during the process 105, when etching into the crystalline portion of the active region 102A, compared to the etch process 104, in which a low etch rate in the crystalline portion of the material 102A may be considered advantageous for providing superior control of the etch process 104 and, thus, of the basic size and configuration of the cavities 102S, 102D.

Figure 1F:
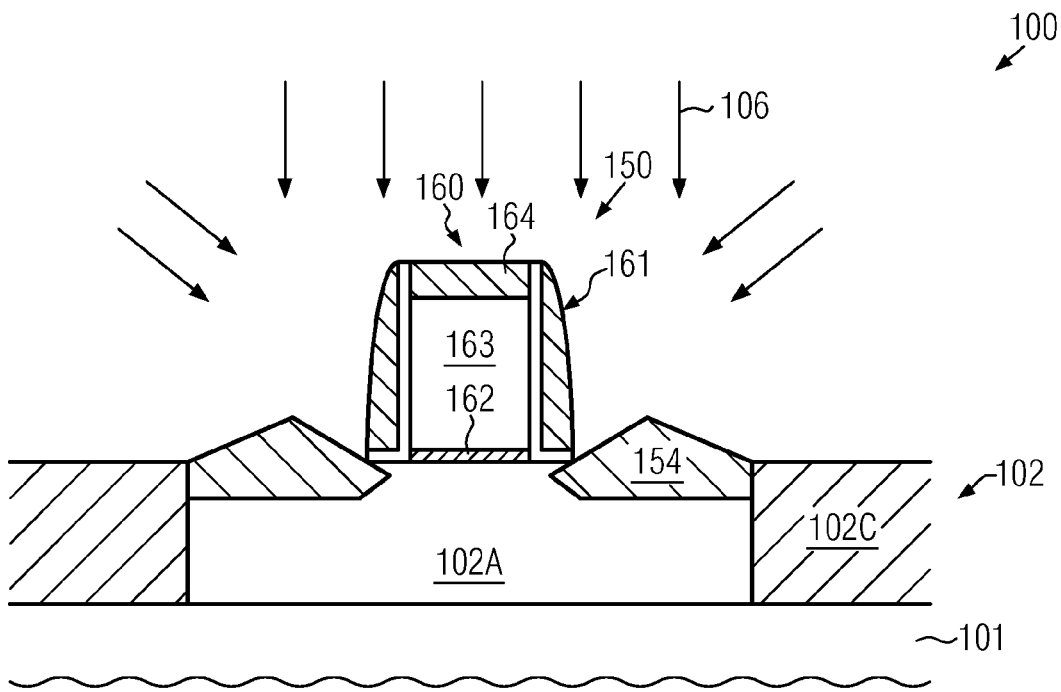

FIG. 1f schematically illustrates the semiconductor device 100 in a further advanced manufacturing stage, in which a selective epitaxial growth process 106 may be applied in order to form a semiconductor material 154, such as a strain-inducing semiconductor material, in the previously provided cavities having the superior uniformity with respect to size and shape. To this end, any appropriate and well-established deposition recipe may be applied, wherein the spacer structure 161 and the dielectric cap layer 164 may act as a deposition mask.

Figure 1G:
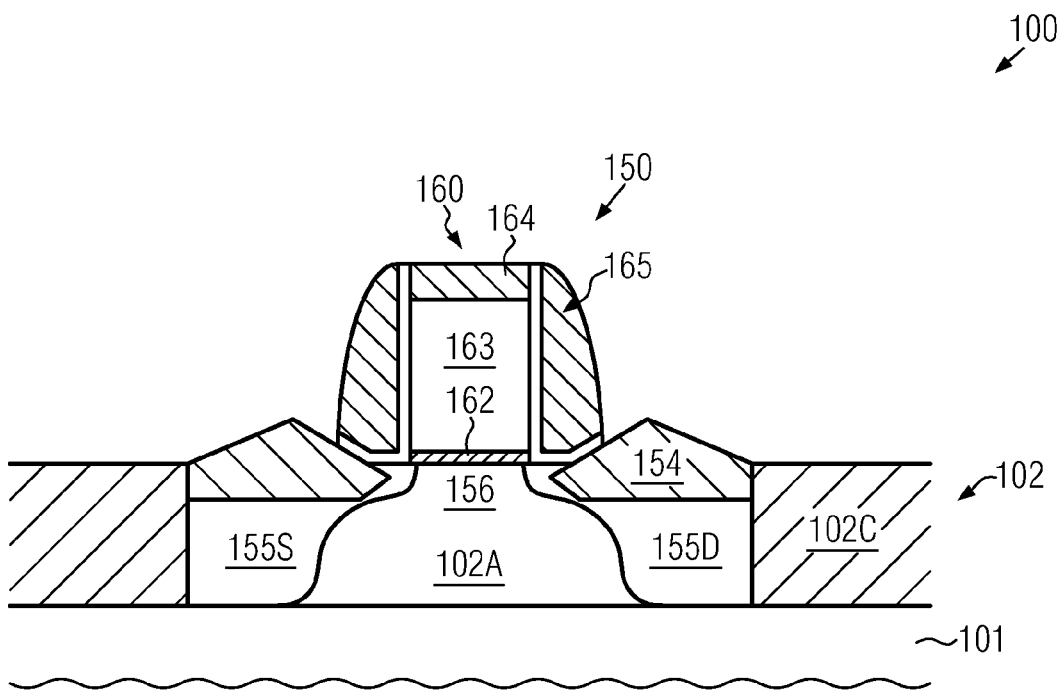

FIG. 1g schematically illustrates the semiconductor device 100 in a further advanced manufacturing stage. As illustrated, the transistor 150 may comprise drain and source regions 155D, 155S, respectively, which may at least partially be formed in the previously formed semiconductor material 154. Furthermore, an appropriate sidewall spacer structure 165 may be provided for the gate electrode structure 160, which may be used for appropriately adjusting the vertical and lateral dopant profiles of the drain and source regions 155D, 155S.

The transistor 150 as shown in FIG. 1g may be formed on the basis of any appropriate process strategy. That is, after forming the semiconductor material 154, for instance in the form of silicon/germanium, silicon/carbon and the like, the spacer structure 161 (FIG. 1f) or a portion thereof and the cap layer 164 may be removed and the drain and source regions 155D, 155S may be formed, possibly in combination with the spacer structure 165, in accordance with well-established process strategies. Thereafter, the final dopant profile of the drain and source regions 155D, 155S may be adjusted on the basis of anneal processes. Thus, appropriate strain conditions may be achieved in the channel region 156 with a high degree of uniformity across the entire device 100, wherein the materials 154 may be provided with any appropriate configuration, for instance with respect to depth, asymmetry, overlap with the gate electrode structure 160 and the like. Hence, a high degree of flexibility in adjusting the performance of the transistor 150 may be obtained, while at the same time superior process uniformity is achieved compared to conventional strategies.

Figure 1H:
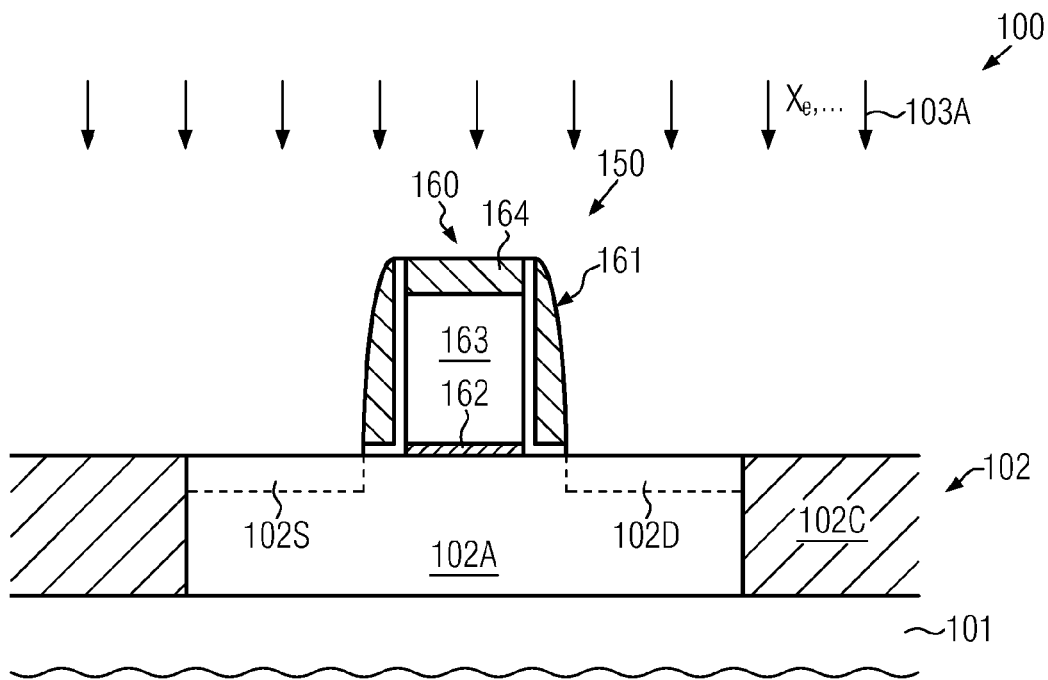
FIGS. 1h-1i schematically illustrate cross-sectional views of the semiconductor device according to still further illustrative embodiments, in which a selective material modification may be accomplished on the basis of an implantation process in combination with one or more additional processes, such as a heat treatment, an oxidation process and the like, so as to appropriately define the size and shape of cavities still to be formed.

FIG. 1h schematically illustrates the semiconductor device 100 during an implantation process 103A in order to modify a portion of the active region 102A, which may substantially correspond to cavities 102S, 102D still to be formed. For example, a xenon species may be incorporated and may be positioned at a desired depth and may be provided with any appropriate overlap with the gate electrode structure 160, as is also previously discussed. In this manner, a maximum concentration with a moderately small concentration spread may be provided within the active region 102A, thereby allowing a precise definition of the size and shape of the cavities 102S, 102D still to be formed.

Figure 1I:
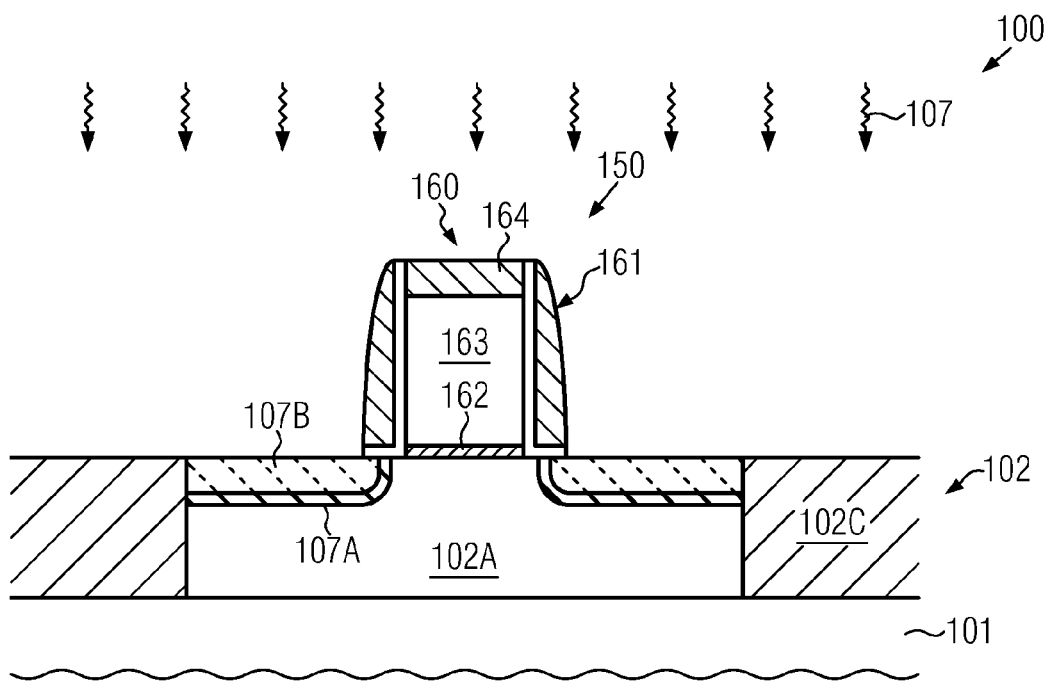

FIG. 1i schematically illustrates the semiconductor device 100 when subjected to a further treatment 107, for instance in the form of a heat treatment so as to re-crystallize any implantation-induced damage, thereby forming a layer 107A comprising the previously incorporated implantation species, such as xenon, while also the portion 107B of a substantially crystalline configuration may be formed, in which a significantly reduced amount of implantation species may be provided, as may, for instance, be seen from FIG. 1c. Thus, the layer 107A may act as an efficient etch control or etch stop material when applying certain chemistries, such as TMAH, thereby obtaining size and shape of the respective cavities as defined by the material 107A, even if the corresponding etch chemistry may basically have a crystallographically anisotropic etch behavior.

In other illustrative embodiments, the treatment 107 may comprise an oxidation process, for instance on the basis of a wet chemical oxidation process, a plasma induced oxidation process and the like, wherein the increased oxidation rate of a substantially amorphized portion of the material may also result in an oxidized portion, the size and shape of which may be substantially defined by the previous implantation process. Consequently, the further processing may be continued on the basis of an etch process, in which preferably the oxidized portion may be removed selectively with respect to the non-oxidized area of the active region 102A, possibly followed by a crystallographically anisotropic etch process, as is also discussed above. Consequently, also in this case, the size and shape may be efficiently adjusted on the basis of a process having a reduced pattern loading dependency, wherein a very efficient subsequent process sequence may result in cavities of superior uniformity, while also providing a high flexibility in adjusting the size and shape of these cavities.

As a result, the present disclosure provides manufacturing techniques in which superior uniformity of transistor elements may be accomplished, when a semiconductor material, such as a strain-inducing semiconductor material, is to be incorporated into the drain and source areas of the transistors. To this end, the basic size and shape of the cavities may be defined by an ion implantation process, which may result in an appropriate modification of the material characteristics, for instance in terms of etch rate, thereby providing superior etch controllability and uniformity during the subsequent actual formation of the cavities. For example, a desired size and shape may be obtained on the basis of wet chemical etch chemistries, even if these chemistries have basically a crystallographically anisotropic etch behavior.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming in an initially crystalline active region of a transistor an amorphous portion laterally adjacent to a gate electrode structure of said transistor;
    performing a first etch process so as to remove material of said amorphous portion in a substantially direction-independent manner and provide a cavity;
    performing a second etch process so as to adjust a size and shape of said cavity, said second etch process having a crystallographically anisotropic removal rate; and
    forming a strain-inducing semiconductor alloy at least in said cavity by performing a selective epitaxial growth process.

2. The method of claim 1, wherein said first etch process is performed as a wet chemical etch process.

3. The method of claim 1, wherein said first etch process is performed by using an isotropic plasma etch process.

4. The method of claim 1, wherein said first and second etch processes are performed as wet chemical etch processes.

5. The method of claim 1, wherein forming said amorphous portion comprises performing an ion implantation process.

6. The method of claim 5, wherein performing said ion implantation process comprises using a non-zero tilt angle.

7. The method of claim 1, wherein said first etch process is performed so as to substantially completely remove said amorphous portion.

8. The method of claim 1, further comprising modifying at least one of a material composition and a crystalline structure of said amorphous portion prior to performing said first etch process.

9. The method of claim 8, wherein a material composition of said amorphous portion is modified and said modified portion has a greater etch rate compared to a non-modified portion of said active region when performing said first etch process.

10. The method of claim 8, wherein said crystalline structure is modified by performing an anneal process.

11. A method of forming a transistor, the method comprising:
    performing an ion implantation process so as to introduce an implantation species into a semiconductor region laterally adjacent to a gate electrode structure, said ion implantation process producing an amorphous portion of said semiconductor region;
    forming cavities in said semiconductor region laterally adjacent to said gate electrode structure by performing an isotropic etch process and controlling said etch process by using said implantation species, wherein said amorphous portion is removed by performing said isotropic etch process;
    forming a strain-inducing semiconductor alloy in said cavities; and
    forming drain and source regions in said semiconductor region.

12. The method of claim 11, wherein forming said cavities further comprises performing a crystallographically anisotropic etch recipe after removal of said amorphous portion.

13. The method of claim 11, wherein forming said cavities further comprises modifying a material composition of a portion of said semiconductor region so as to have an increased etch rate.

14. The method of claim 11, wherein performing said ion implantation process comprises using a tilt angle.

15. The method of claim 11, wherein performing said ion implantation process comprises using a first parameter setting for introducing said implantation species at a drain side and using a second parameter setting for introducing said implantation species at a source side, wherein said first parameter setting differs from said second parameter setting.

16. A method of forming a semiconductor device, the method comprising:
    modifying a portion of an active region of a transistor so as to produce an amorphous portion of said active region that has an increased removal rate with respect to an isotropic etch recipe;
    performing an etch process and applying said etch recipe so as to remove said amorphous portion and thereby form a cavity in said active region;
    forming at least one inclined sidewall surface in said cavity; and
    forming a strain-inducing semiconductor alloy in said cavity.

17. The method of claim 16, wherein forming at least one inclined sidewall surface comprises performing a wet chemical etch process having a different removal rate with respect to at least two different crystal axes.

18. The method of claim 16, wherein modifying a portion of said active region comprises incorporating an implantation species.

19. A method of forming a transistor, the method comprising:
    performing an ion implantation process so as to introduce an implantation species into a semiconductor region laterally adjacent to a gate electrode structure, wherein performing said ion implantation process comprises using a first parameter setting for introducing said implantation species at a drain side and using a second parameter setting for introducing said implantation species at a source side, wherein said first parameter setting differs from said second parameter setting;
    forming cavities in said semiconductor region laterally adjacent to said gate electrode structure by performing an etch process and controlling said etch process by using said implantation species;
    forming a strain-inducing semiconductor alloy in said cavities; and
    forming drain and source regions in said semiconductor region.

* * * * *